United States Patent [19]

Orchard-Webb

[11] Patent Number: 5,166,764

[45] Date of Patent: Nov. 24, 1992

[54] INPUT PROTECTION DEVICE

[75] Inventor: Jonathan H. Orchard-Webb, Ontario, Canada

[73] Assignee: Mitel Corporation, Kanata, Canada

[21] Appl. No.: 730,067

[22] Filed: Jul. 15, 1991

[30] Foreign Application Priority Data

Jul. 13, 1990 [CA] Canada .................................. 2021184

[51] Int. Cl.$^5$ ..................... H01L 29/06; H01L 29/72; H02H 9/00
[52] U.S. Cl. ...................................... 257/578; 361/56
[58] Field of Search .................. 357/23.13, 34, 35, 36; 361/56, 91

[56] References Cited

U.S. PATENT DOCUMENTS 4,720,737  1/1988  Shirato ............................. 357/23.13

FOREIGN PATENT DOCUMENTS 0257774  3/1988  European Pat. Off. ......... 357/23.13

Primary Examiner—Mark V. Prenty
Attorney, Agent, or Firm—Richard J. Mitchell

[57] ABSTRACT

An integrated circuit has an input protection device including a bipolar transistor to shunt current away from sensitive areas of the circuit during an e.s.d. event. The bipolar transistor includes floating electrodes on the base to define an equipotential base region so that the effective size of the emitter, and hence the currently handling capability of the transistor, is increased.

8 Claims, 3 Drawing Sheets

INPUT PROTECTION DEVICE

BACKGROUND OF THE INVENTION

This invention relates to an integrated circuit having an input protection device including a bipolar transistor to shunt current away from sensitive areas of the circuit during an e.s.d. (electrical surge discharge) event.

Metal oxide semiconductor integrated circuits (MOS) ICs are extremely sensitive to surge discharges. This is particularly true of the gate oxide regions in the circuit. In order to protect such ICs, it is known to provide a bipolar transistor in the input protection circuit to shunt current away from these sensitive areas during a discharge event. However, the current handling capability of such devices is inherently limited due to the fact that the voltage drop across the high resistivity base limits emitter current to flowing only along the extreme edge of the emitter.

An object of the present invention is to alleviate the aforementioned disadvantage by increasing the current handling capability of such input protection devices.

SUMMARY OF THE INVENTION

Accordingly the present invention provides an integrated circuit with an input protection device including a bipolar transistor to shunt current away from sensitive areas of the circuit during an e.s.d. event, wherein the bipolar transistor includes floating electrodes on the base to define an equipotential base region so that the effective size of the emitter is increased.

The input power handling in the input shunt transistor is improved by providing a larger active emitter. This is achieved by minimizing the voltage drop across the active emitter so that the latter can be made two dimensional instead of linear.

Preferably, the emitter comprises a plurality of spaced fingers in the base region and said floating electrodes comprise conductive strips interdigitated between the fingers. The floating electrodes and emitter fingers can be contacted and metallized to reduce the voltage drop.

There are many possible ways of implementing bipolar transistors. The invention relates generally to both npn and pnp transistors.

By allowing a much larger effective emitter to be used, the invention permits the current handling capability of the transistor to be commensurately increased.

BRIEF DESCRIPTION OF THE DRAWINGS

The invention will now be described in more detail, by way of example only, with reference to the accompanying drawings in which.

DESCRIPTION OF THE PREFERRED EMBODIMENTS

Figure 1:
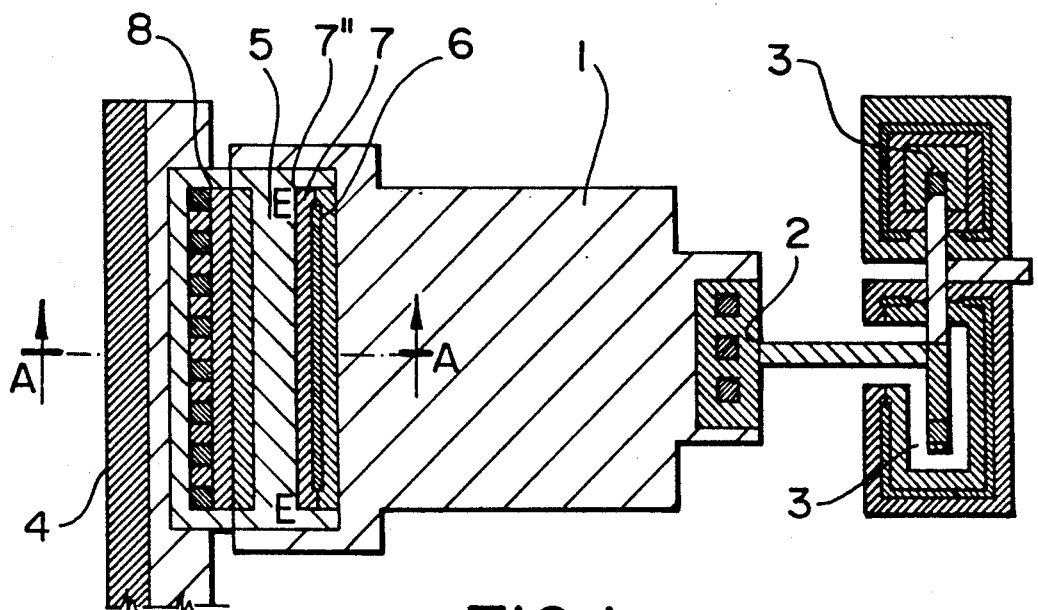
FIG. 1 is a plan view of a conventional input structure for a MOS integrated circuit with part of the input contact cut away.
Figure 2:
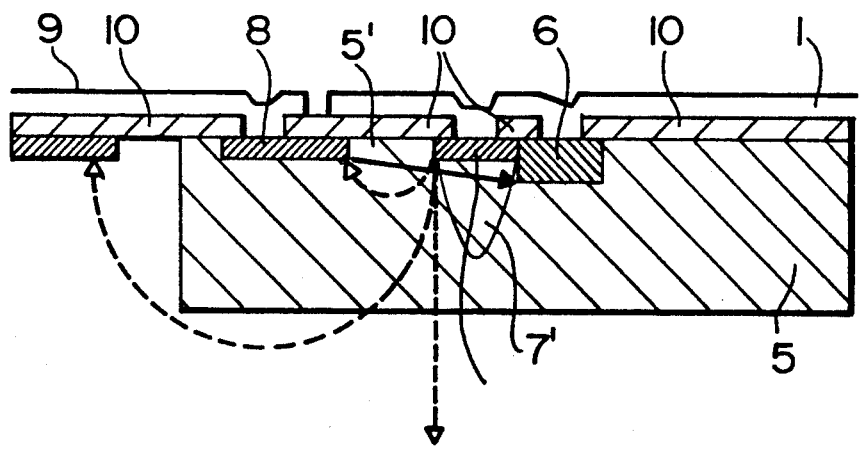
FIG. 2 is a section taken along the line A—A in FIG. 1.
Figure 3:
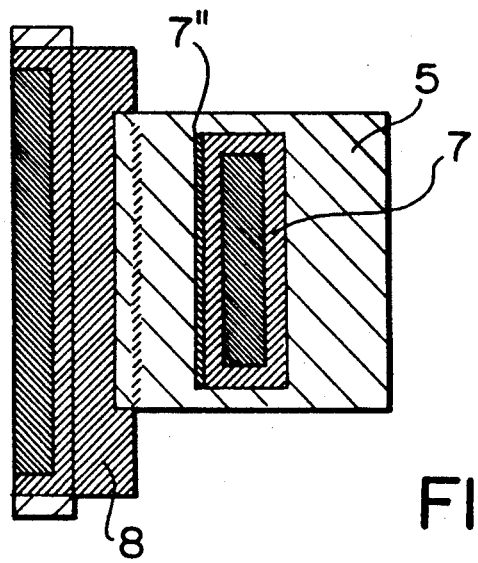
FIG. 3 is a plan view of a prior art bipolar input protection transistor for comparison with FIG. 4.

Referring now to FIGS. 1 and 2, the semiconductor device has a metal input contact 1 connected to the integrated circuit (not shown) by means of an input resistor 2 and clamping diodes 3.

A bipolar shunt transistor, generally designated 4, is connected to the input contact 1. Transistor 4 has a p-well base region 5, a p+base contact 6 connected to the input contact 1, an n+emitter 7, also connected to the input contact 1, and an n+collector 8 connected to voltage supply Vdd through metal collector contact 9. An oxide insulating layer 10 protects the base 5 from the metal contacts 1 and 9.

The operation of this device is as follows: Under negative discharges on the input pad, the common n+/p+base contact shorts out the emitter base junction at low voltages. As a result transistor action inhibited. As the voltage rises avalanche breakdown occurs in the collector-base junction, but transistor action is still inhibited due to the short-circuiting of the emitter-base junction by the common input contact 1. Eventually, as the avalanche current flowing to the p+contact continues to grow, sufficient voltage (in this device about 0.7 V) is dropped across the base region 7' (FIG. 2) under the n+emitter, to forward-bias the emitter, thereby allowing transistor action through the base region 5, between the emitter 7 and collector 8. The turn-on can be greatly assisted by depletion penetration of the region 7'. The transistor switches to a low-impedance state and potentially harmful current is shunted away from the voltage sensitive gate oxide regions in the integrated circuit. Under positive discharges, the p+regions forward bias and cause the current to be safely conducted to the substrate.

A defect with this device is that due to the voltage drop across the high resistivity p- well base, emitter current can only flow along the extreme edge 7" of the emitter 7 shown in FIG. 1. This in effect makes the emitter a line source, which severely limits the current that the transistor can conduct.

Figure 4:
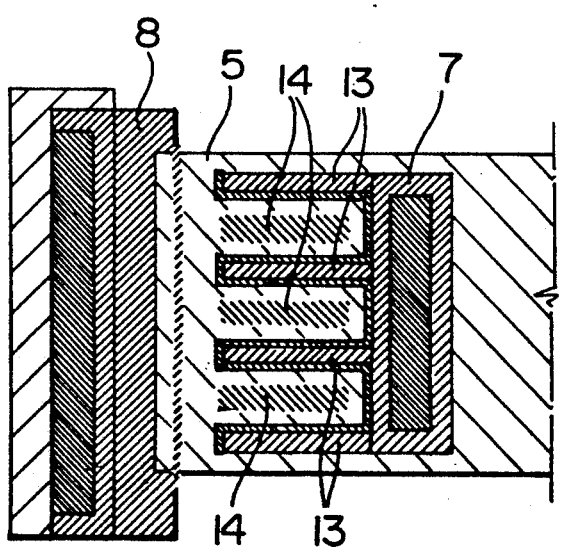
FIG. 4 is a plan view of a bipolar input protection transistor in accordance with one embodiment of the present invention.

Referring now to FIG. 4, the p- well base 5 has an n+emitter 7 provided with a series of parallel fingers 13 extending over the base region towards n+type collector 8. Interdigitated with the fingers 13 is a series of unconnected p+floating electrodes 14 whose purpose is to provide an equipotential base region in their vicinity. The electrodes 14 can be diffused into the substrate in the same way as the base contact 6.

The emitter fingers are metallized along their edges 15 facing the equipotential electrodes 14. The latter can also be metallized along their edges (not shown) to give even better shorting of the potential drop on the base. The emitter fingers can be contacted with contact window openings and metallization. The p+regions can also be contacted and metallized to give even better shorting of the voltage drop in the base.

The presence of the equipotential zone allows the size of the emitter to be substantially increased. When transistor action occurs current carriers (in this case electrons) can flow into the emitter along the whole periphery of the fingers facing the floating electrodes and the ends of the fingers because there is a substantially reduced voltage drop in this region. The current handling capability of the transistor is thus substantially increased.

The invention has been described with reference to a p- well transistor, but will work equally well with an n- well transistor in which case the polarities of the various layers are reversed.

Figure 5:
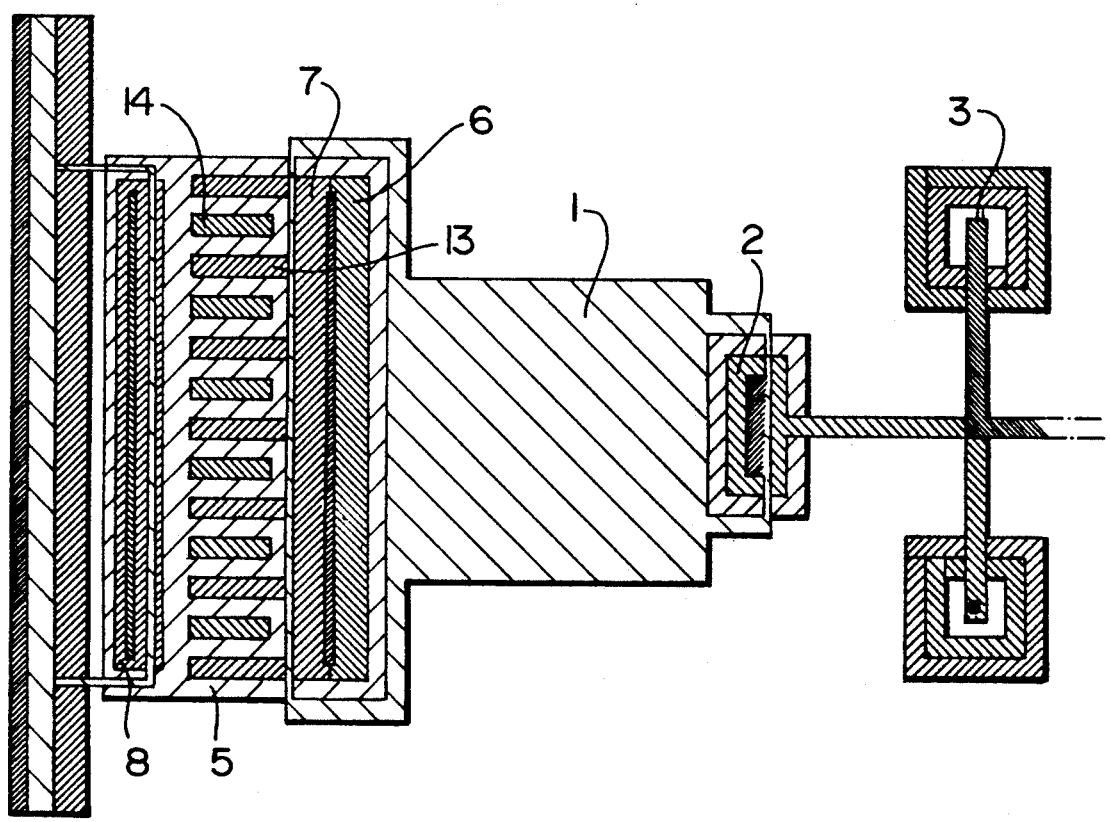
FIG. 5 shows a complete input protection circuit for a MOS integrated circuit incorporating a bipolar transistor in accordance with the invention.

A complete input structure embodying the present invention is shown in FIG. 5. The emitter 7 with fingers 13 interdigitated with base floating electrodes 14 opposes collector 8 connected to Vdd.

The increased current handling capability of the described protection device offers substantially enhanced protection for the associated integrated circuit.

I claim:

1. In an integrated circuit having an input protection device including a bipolar transistor to shunt current away from sensitive areas of the circuit during an (e.s.d) electrical surge discharge event, the bipolar transistor including a base, an emitter, and a collector, the improvement wherein the bipolar transistor further includes floating electrodes on the base to define an equipotential base region so that the effective size of the emitter is increased.

2. An integrated circuit as claimed in claim 1, wherein said emitter comprises a plurality of spaced fingers on the base and said floating electrodes comprise conductive strips located on the equipotential base region between the fingers.

3. An integrated circuit as claimed in claim 1, wherein said base is a p- well base and said floating electrodes consist of p+ material.

4. An integrated circuit as claimed in claim 1, wherein said base is a n- well base and said floating electrodes consist of n+ material.

5. An integrated circuit having an input protection device including a bipolar transistor to shunt current away from sensitive areas of the circuit during an electrical surge discharge (e.s.d.) event, said bipolar transistor comprising a substrate of one conductivity type, spaced emitter and collector regions of the opposite conductivity type provided in said substrate, a base region, an enhanced conductivity base contact region adjacent the emitter on the side thereof remote from the collector, a common electrode connected to said emitter and base contact regions which shorts out the emitter-base junction until the avalanche current flowing beneath the emitter forward-biases the emitter-base junction, and a plurality of floating electrodes on said substrate between said emitter and collector defining an equipotential zone in the base to permit the effective size of the emitter-base junction to be increased during transistor action subsequent to the emitter-base junction becoming forward-biased.

6. An integrated circuit as claimed in claim 5, wherein said emitter comprises a plurality of spaced fingers on the base region and said floating electrodes comprise conductive strips located in the base region between said fingers.

7. An integrated circuit as claimed in claim 5, wherein said base is p- type, said emitter and collector regions are n+-type, and said base contact region is p+.

8. An integrated circuit as claimed in claim 5, wherein said base is n - type, said emitter and collector regions are p+-type, and said base contact region is n+.

* * * * *